US006477052B1

United States Patent
Barcley

(10) Patent No.: US 6,477,052 B1
(45) Date of Patent: Nov. 5, 2002

(54) MULTIPLE LAYER THIN FLEXIBLE CIRCUIT BOARD

(75) Inventor: Tina Barcley, Rochester Hills, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 09/630,221

(22) Filed: Aug. 1, 2000

(51) Int. Cl.[7] .................................................. H05K 7/20
(52) U.S. Cl. ........................ 361/719; 174/252; 174/259; 361/749
(58) Field of Search ................................ 174/16.3, 252, 174/254, 259; 165/80.3, 185; 361/688, 690, 704–708, 715, 719–721, 749; 428/901

(56) References Cited

U.S. PATENT DOCUMENTS

| | | | |
|---|---|---|---|
| 4,847,146 A | * 7/1989 | Yeh et al. .................... 428/901 |
| 5,103,375 A | 4/1992 | Cottingham et al. |
| 5,170,326 A | 12/1992 | Meny et al. |
| 5,355,280 A | * 10/1994 | Rothlingshofer et al. ... 361/705 |
| 5,450,286 A | * 9/1995 | Jacques et al. ............. 361/749 |
| 5,783,862 A | * 7/1998 | Deeney ....................... 361/708 |
| 5,789,815 A | 8/1998 | Tessier et al. |
| 5,969,945 A | * 10/1999 | Cutting et al. .............. 361/704 |
| 5,982,630 A | 11/1999 | Bhatia |
| 5,986,886 A | 11/1999 | Sasov |
| 5,998,738 A | 12/1999 | Li et al. |
| 6,037,658 A | * 3/2000 | Brodsky et al. ............ 361/705 |
| 6,054,198 A | * 4/2000 | Bunyan et al. ............. 361/704 |
| 6,275,381 B1 | * 8/2001 | Edwards et al. ............ 361/705 |

* cited by examiner

Primary Examiner—Gregory Thompson
(74) Attorney, Agent, or Firm—Ralph E. Smith; Edwin W. Bacon, Jr.

(57) ABSTRACT

A printed circuit board, containing thermal pads, is adhered to a rigidizer plate whereupon the entire unit can then be bent over itself to create a compact assembly which can be substantially smaller, but contain the same number of traces and electrical components, as an unbent printed circuit board of the same surface area. Further, a complete housing assembly is formed which is sealed on each edge of the rigidizer by inserting the edge into a panel with a groove. This assembly provides a secure fit that provides great stability with a relatively low weight and volume. The assembly also provides a better RF non-mechanical connection and much better thermal performance.

17 Claims, 11 Drawing Sheets

MULTIPLE LAYER THIN FLEXIBLE CIRCUIT BOARD

FIELD OF THE INVENTION

The present invention relates generally to automotive electronic control assemblies, and more particularly to electronic control assemblies containing printed circuit boards.

BACKGROUND

Automotive electronic control assemblies are well known in the art, however, they contain several distinct disadvantages. Most often the assemblies contain a relatively small printed circuit board heavily populated with electrical traces and components. Furthermore, these assemblies must be contained within a thick housing that increases the overall mass of the assembly. Moreover, the housings are then required to be filled with a potting material to ensure that the components and connections are kept clean of various materials that may infect the assembly. In addition, the printed circuit board has an RF ground that is typically mechanically attached to a ground member. This type of assembly lacks in that it is heavy and has poor heat sink capabilities.

Some assemblies have attempted to solve some of these problems by bending the assembly upon itself, such assemblies are disclosed in U.S. Pat. Nos. 5,998,738; 5,103,375; 5,170,326. These assemblies attempt to reduce the volume and weight of the assembly overall. However, the disclosures also contain areas of needed improvement. Most of these assemblies disclose a mandrel about which the assembly is bent and this mandrel is not removed. This internal mandrel unit increases the weight of the assembly. Furthermore, these disclosures require either a non-continuous printed circuit board or a unique and labor intensive adhesive process. All of these are disadvantages of the previous art.

SUMMARY OF THE INVENTION

According to the present invention a printed circuit board is adhered to a rigidizer plate whereupon the entire unit can then be bent over itself to create a compact assembly which can be substantially smaller, but contain the same number of traces and electrical components as a flat printed circuit board. Further, the present invention discloses a complete assembly which is sealed on each edge of the rigidizer by inserting the edge into a panel with a groove. The panel can be a plate, casting or an extrusion. This assembly provides a secure fit that provides great stability with a reduction in weight and volume.

Furthermore, according to the present invention a thermal pad design is provided to heat sink thermal energy, created by components on a printed circuit board, to a rigidizer/heatsink plate. First, the printed circuit board is adhered to the rigidizer plate with an adherent that is thermally conductive and compliant. Moreover, the printed circuit board contains pads with thermal vias to dissipate heat from components to the rigidizer plate.

Additionally, the rigidizer plate is formed so as to minimize stresses placed upon the printed circuit board during bending and after being bent. The present invention, while reducing stresses, provides for a printed circuit board adhered to the rigidizer plate and openings in the rigidizer plate to minimize stresses during bending. The bending area can also be removed with the use of a breakaway piece.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
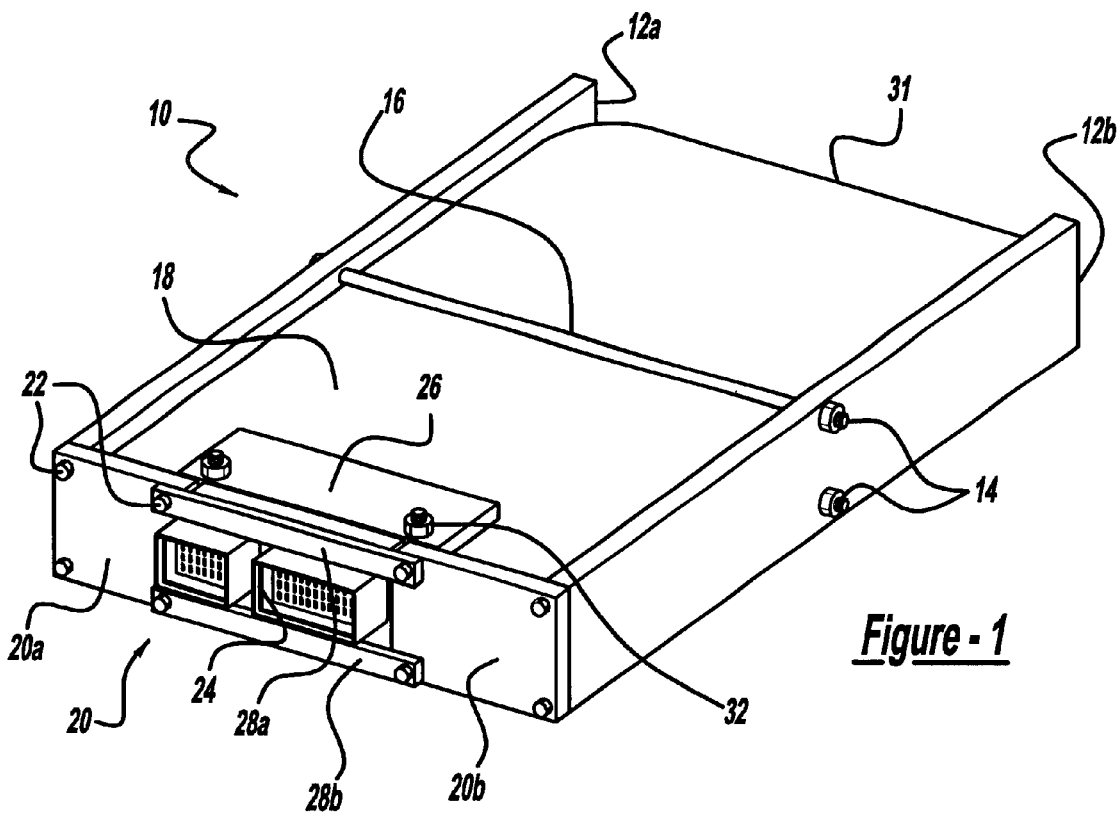
FIG. 1 is a front-top perspective view of the assembly in its completed form.
Figure 2:
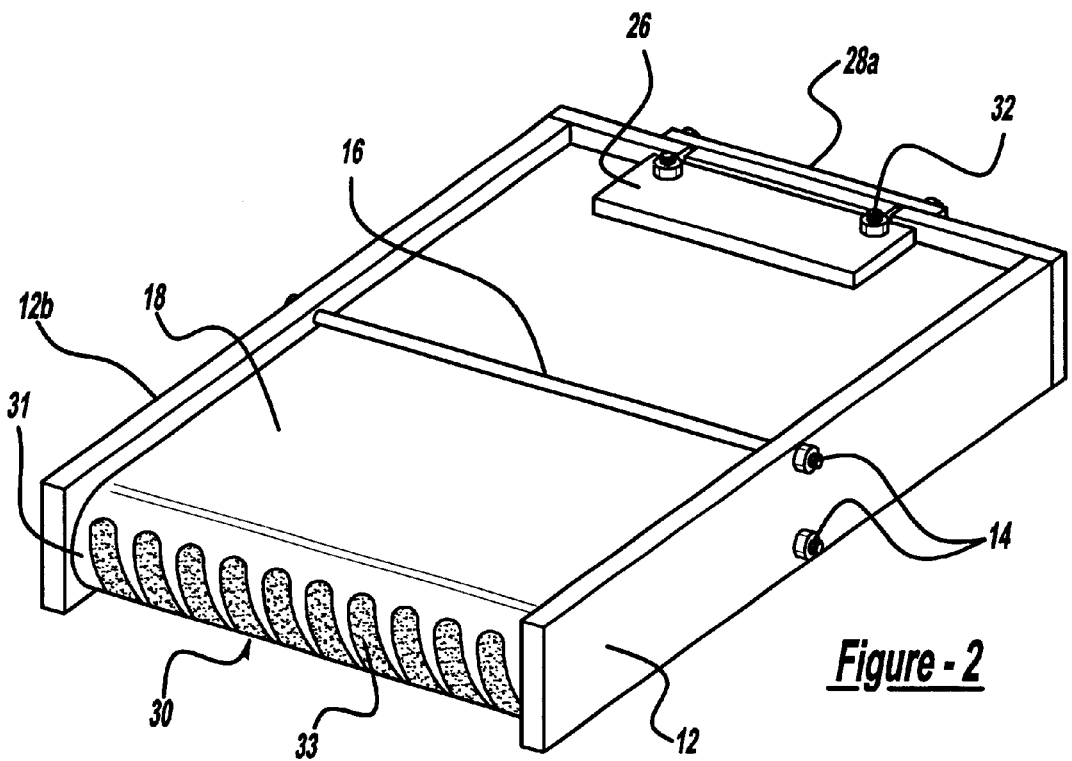
FIG. 2 is a back-top perspective view of the assembly in its completed form.
Figure 3:
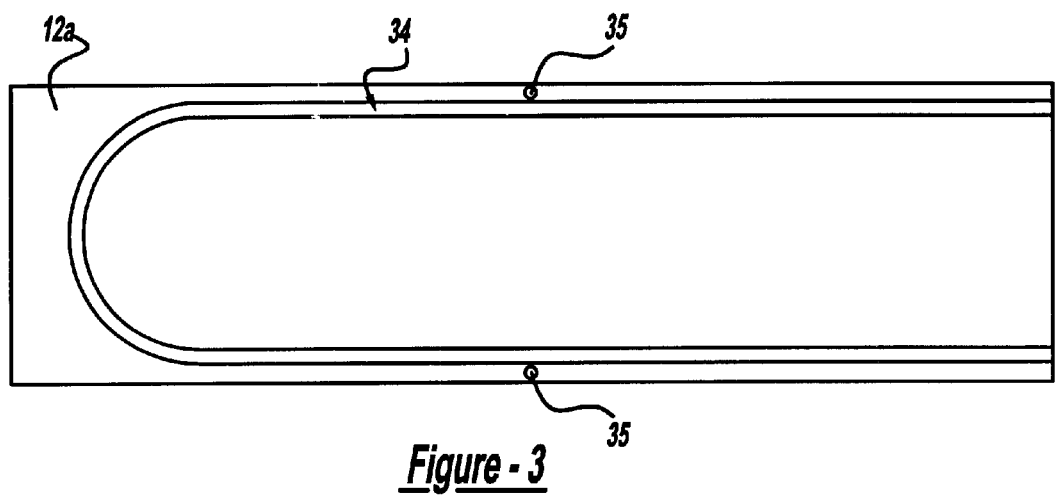
FIG. 3 is a plan view of a side rail according to the principles of the present invention.
Figure 4:
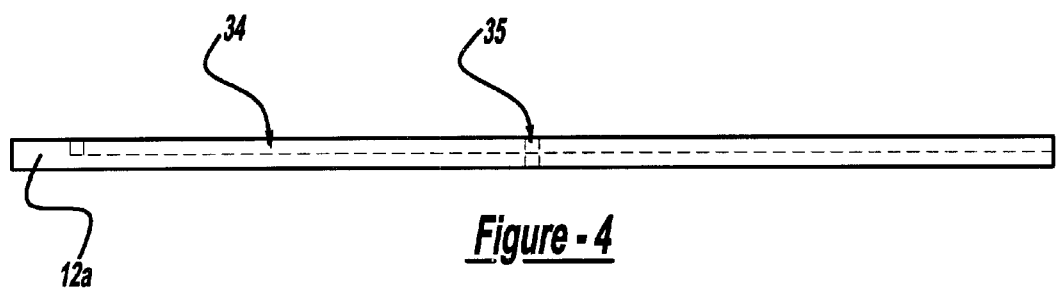
FIG. 4 is a top view of a side rail according to the principles of the present invention.

FIGS. 1 and 2 show the entire assembly of an automobile control module 10 in its complete and assembled manner, according to an embodiment of the present invention. The outer portion of the assembly 10 is comprised of: a rigidizer/heatsink plate 18, two side rails 12a and 12b, front plate 20, and a board connector 24. The rigidizer plate 18 is a continuous piece of metal that is printed circuit board having bent upon itself around a bend axis 31. This design allows for a greater surface area to fit in a much smaller volume than otherwise attainable. The printed circuit board which is adhered to the rigidizer plate 18 will be described in greater detail herein. The side rails 12a and 12b are placed on the edges of the rigidizer plate 18 after the rigidizer plate 18 is in its bent form. With continued reference to FIG. 1 and further reference to FIGS. 3 and 4, it can be seen that the side rails 12a and 12b contain grooves 34 to receive the edge of the bent rigidizer plate 18. Furthermore, the side rails 12a and 12b contain holes 35 for receiving retaining bolts 16. Side rails 12a, 12b and front plate 20 can be combined into a casting of one piece with a similar groove.

Returning with further reference to FIGS. 1 and 2 the retaining bolts 16 are inserted through holes 35 in the side rails 12a and 12b and are held in place with nuts 14. This connection provides support for the assembly 10 and seals the outside edges of the assembly 10. The front plate 20 is comprised of two main pieces 20a and 20b connected by two minor pieces 28a and 28b. These pieces 20a, 20b, 28a, 28b create a front enclosure that surrounds the board connector 24. The main pieces 20a, 20b are secured to the minor pieces 28a, 28b and to the side rails 12a and 12b with threaded fasteners 22. Support member 26 in the form of a gasketed cover provides further strength to the component harness area as well as sealing to the module and is mounted to the rigidizer 18 with nut and bolt assemblies 32 and to the front plate 20 with threaded fasteners 22.

Particularly referencing FIG. 2 the bend radius 31 of the rigidizer plate 18 contains a plurality of elongated slots 30. These slots 30 are diagonal to the axis of the bend radius 31 and provide a relief of stress to the rigidizer plate 18. The slots 30 are filled with an adhesive 33 providing an additional portion of protection to prevent foreign objects from getting inside the assembly 10 and seal the module for pressurizing. Including the adhesive 33 that fills in the holes 30, the side rails 12a and 12b, and the front plate 20 the assembly 10 is completely contained within a structure that can endure extreme conditions, including those under the hood of an automobile.

Figure 5:
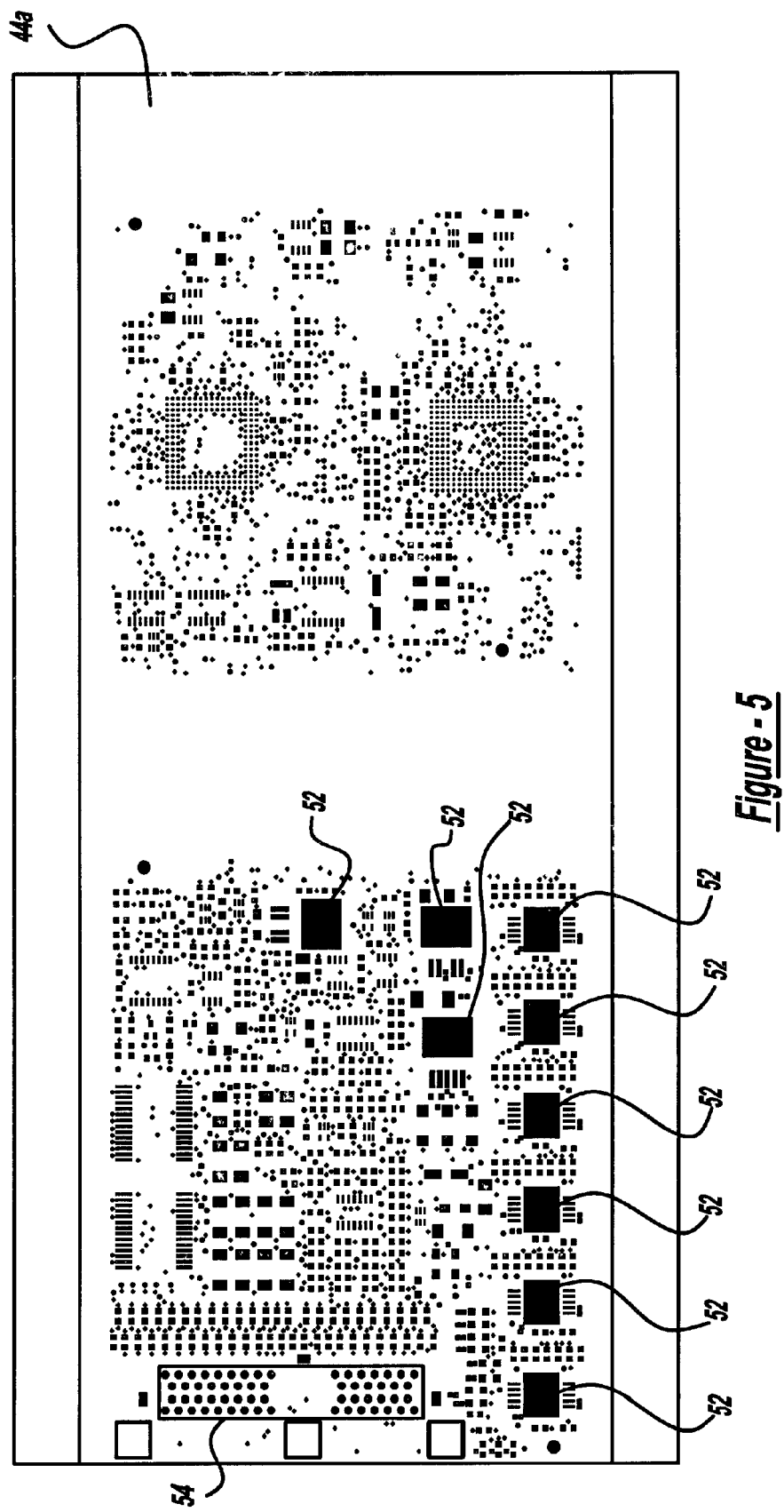
FIG. 5 is a plan view of a top core of a printed circuit board.
Figure 6:
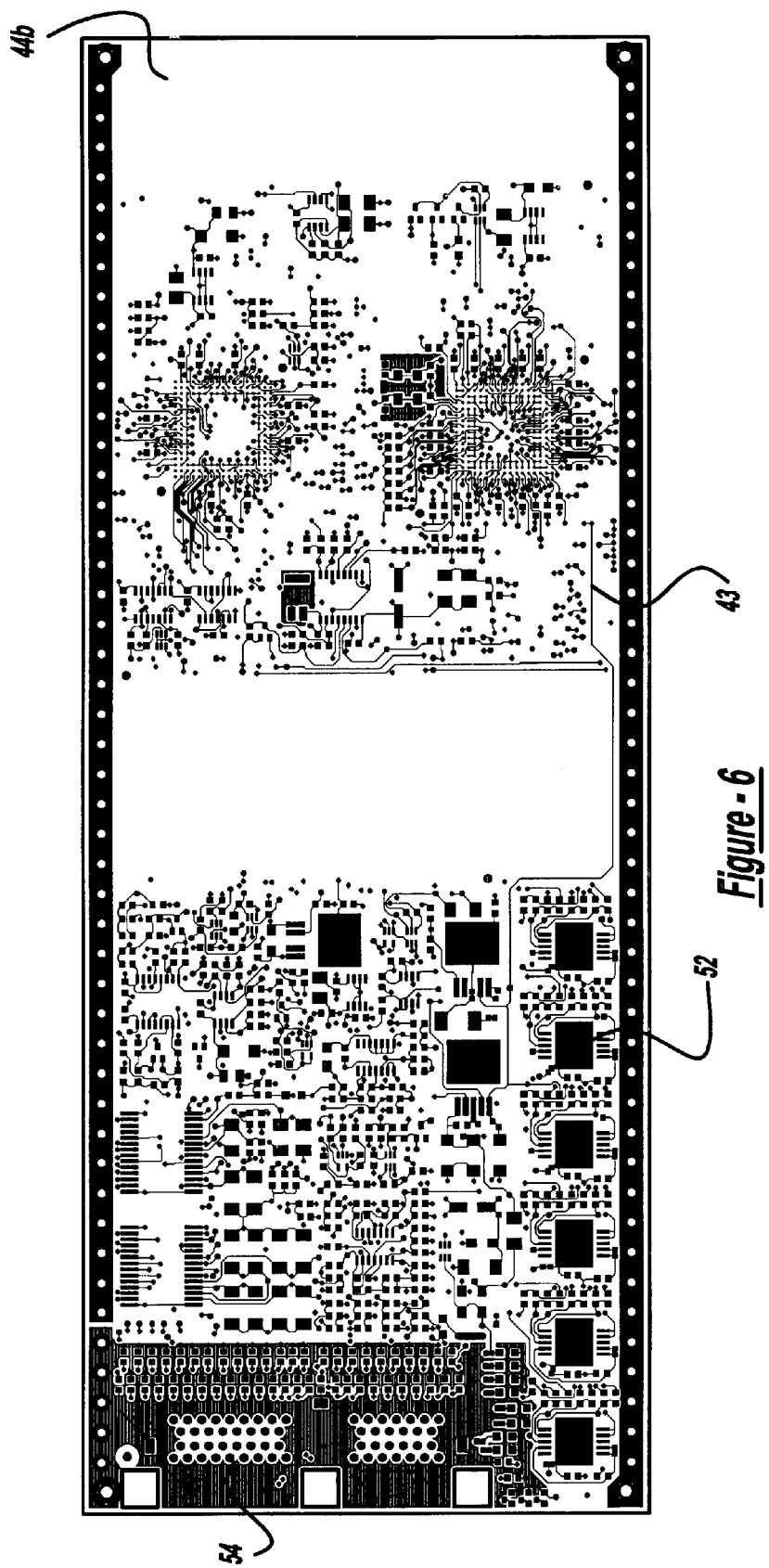
FIG. 6 is a plan view of a core of the printed circuit board containing horizontal traces.
Figure 7:
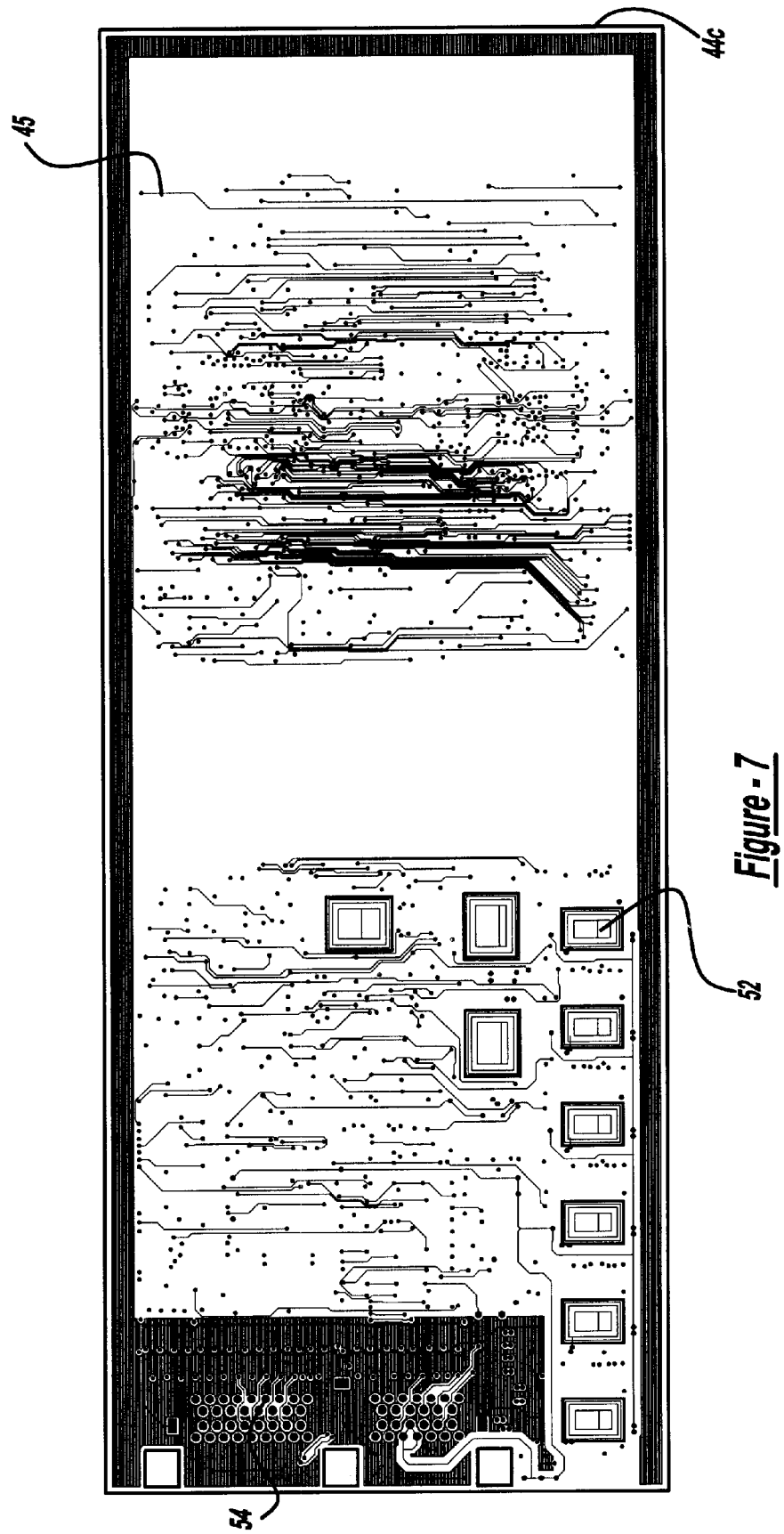
FIG. 7 is a plan view of a core of the printed circuit board containing vertical traces.
Figure 12:
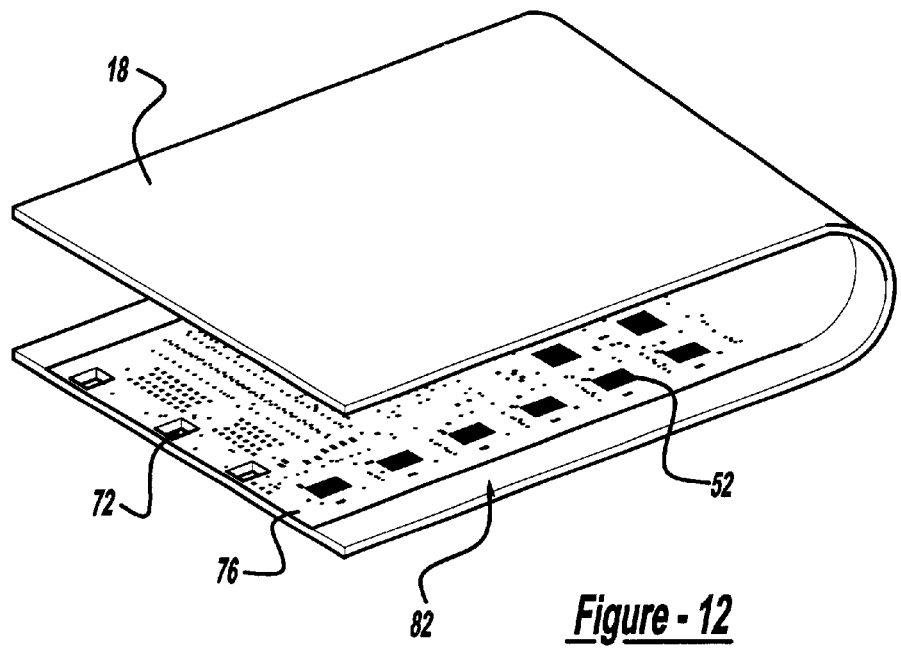
FIG. 12 is a perspective view of the bent rigidizer and printed circuit board with-out the final enclosures.
Figure 13:
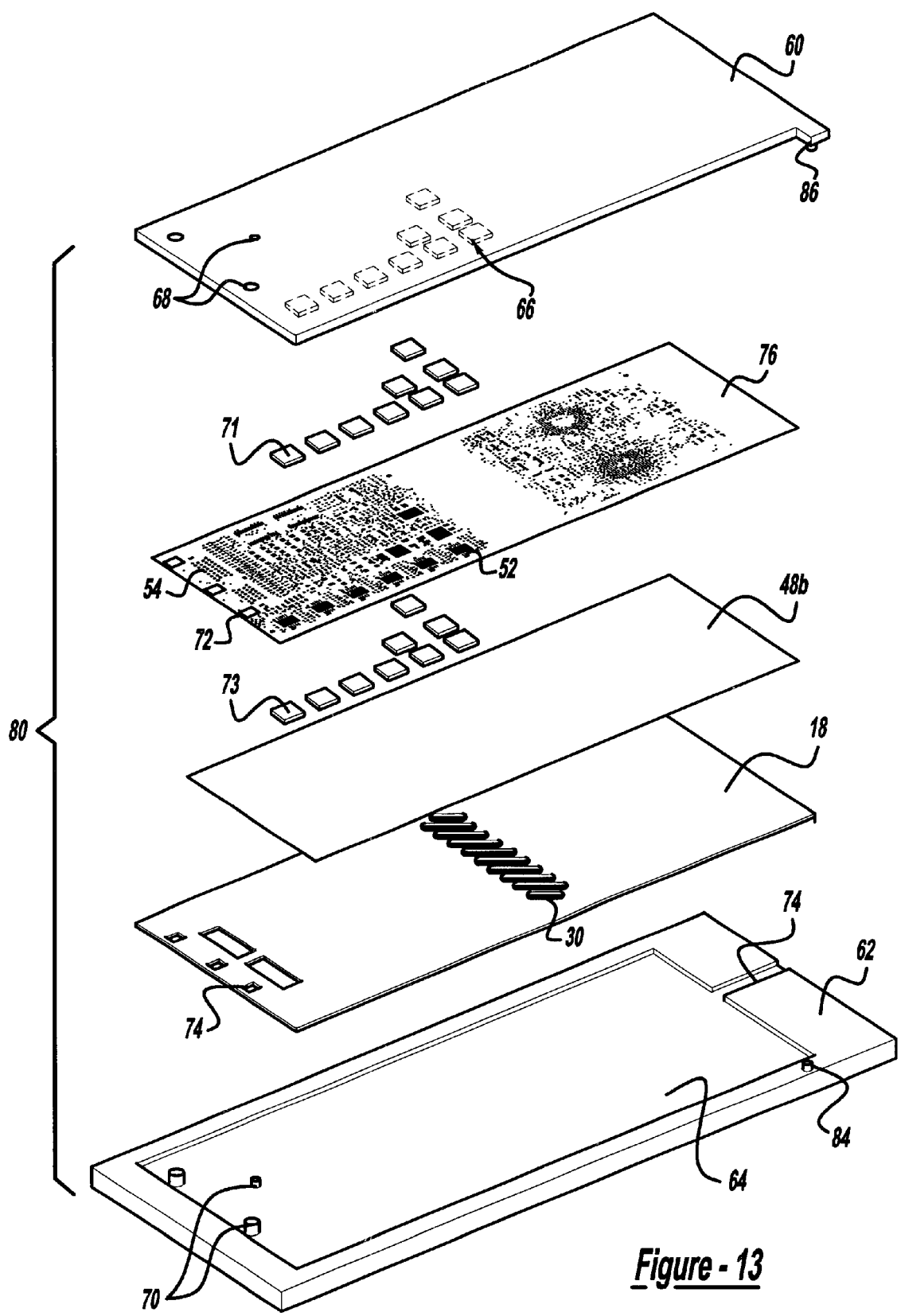
FIG. 13 is an exploded perspective view of the parts and process of adhering the printed circuit board to the rigidizer also showing the fixture to perform the task.

FIGS. 5, 6, and 7 reference the first three layers or cores in their unbonded formation of the four layer bonded printed circuit board (PCB) 76 shown generally in FIGS. 12 and 13. FIG. 5 shows the first layer 44a of the PCB 76. The first layer 44a indicates the general placement of components and their connections 53 (as is well known in the art) to the traces and the thermal pads 52. Also the vias 54 for the connector harness 24 (shown in FIG. 1) are shown. FIG. 6 is a plan view of a second layer 44b of the PCB 76. The second layer 44b generally contains horizontal traces 43 for connecting components that may be placed upon the first layer 44a. The second layer 44b also shows the grounding and some connections 54 for the connector harness 24. FIG. 7 shows the third layer 44c of the circuit board, and also shows grounding and some connections for the connector. This layer generally contains the vertical traces 45 as is known in the art. The PCB 76 has four layers with 2 mil cores and is flexible and is commercially available from Photocircuits, Glen Cove, N.Y.

Figure 8:
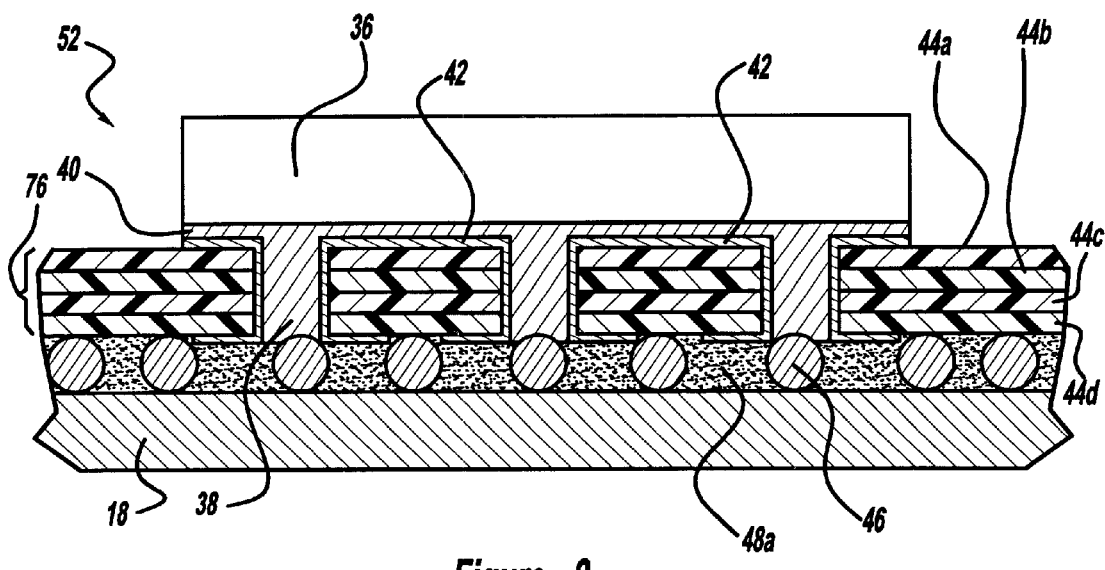
FIG. 8 is a cross-sectional view through a thermal via with a studded component.

FIG. 8 is a cross-sectional detail of a thermal pad 52 on a PCB 76 bonded to a rigidizer 18. The thermal pad 52 contains a plurality of thermal vias (or holes) 38. The PCB 76 contains four layers 44a, 44b, 44c, 44d bonded together, the order of which can be dictated by the design. Once the layers 44a, 44b, 44c, 44d are bonded the thermal vias 38 are formed through all layers 44a, 44b, 44c, 44d of the PCB 76. The thermal vias 38 are formed in a predetermined pattern and size. Once the thermal vias 38 are drilled in the PCB 76 then a thin layer 42 is plated onto the PCB 76 in the area of the thermal pads 52 and on the walls 39 of the thermal vias 38. The area is then plated again with the same or a different material 42a. The entire component is called the thermal pad 52. The thermally conductive material 42 is preferably copper. Layer 42a, can be a variety of materials such as palladium, nickel, gold, immersion silver, immersion tin, or OSP, which is an organic.

Once the PCB 76 is bonded together it is then adhered to a rigidizer plate 18 with a thermally conductive adhesive 48a. In a first embodiment the adhesive 48a is a liquid with glass beads 46 disposed therein. The glass beads 46 are of a generally uniform diameter to help ensure a generally uniform thickness of the adhesive layer 48a. The beads are beneficial due to the fact that during the curing of the adhesive 48a pressure is applied to the PCB 76 and the rigidizer plate 18, thus the glass beads 46 act as a spacer. The liquid adhesive is preferably Dow Corning 1-4175.

Once the PCB 76 is adhered to the rigidizer plate 18, components 36 may be reflow or hand-soldered onto the thermal pad 52. Large components 36 may contain a metal stud to which the solder 40 adheres. Then, while the solder 40 is flowing it fills the thermal vias 38 and comes into contact with the adhesive 48a. To ensure that a sufficient amount of solder 40 is placed below the component 36 a larger area of solder paste is laid on the thermal pad 52 area. The solder paste extends approximately 0.005 to 0.050 inches on each side of the component 36 surface area. In this way it is assured that a sufficient amount of solder 40 is placed on the thermal pad 52 to fill the thermal vias 38. Through filling the thermal vias 38 and contacting both the stud in the component 36 and the adhesive 48a there is created a direct thermal path from the component 36 to the rigidizer plate 18, which acts as a heatsink. A standard 7 or 8 mil stencil is used (industry standard); however, the squeegee does 2 passes across the board to better press solder paste into the thermal via hole.

Figure 8A:
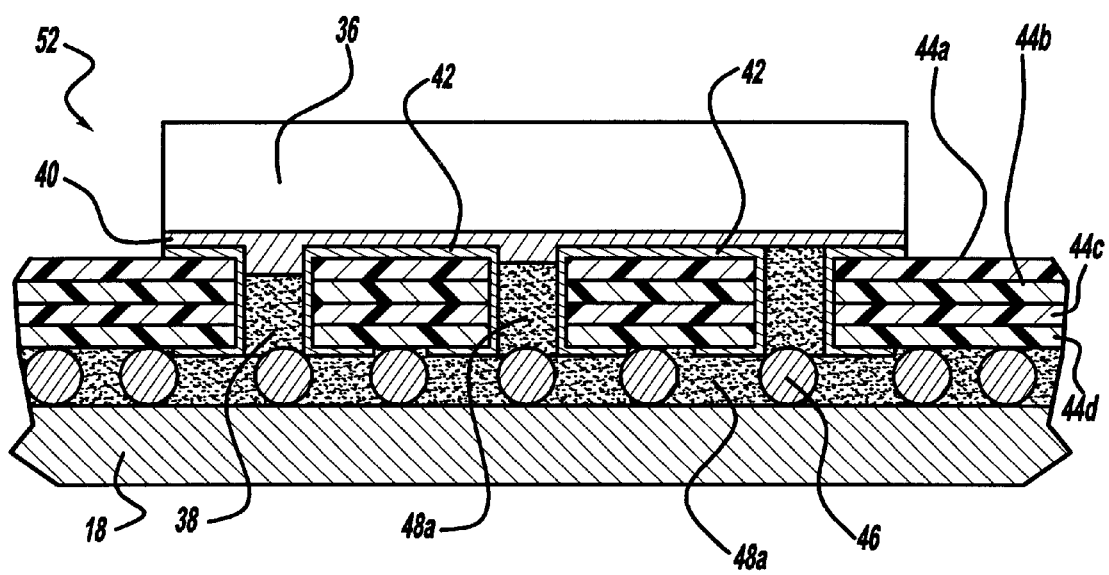
FIG. 8a is a cross-sectional view through a thermal via with a studded component where thermal vias are filled with adhesive.

FIG. 8a is a second embodiment as to how to fill the thermal vias 38 created in the thermal pad 52. In this embodiment the thermal vias 38 are left unmasked during the curing process of the liquid adhesive 48a. Leaving the thermal vias 38 unmasked allows the liquid adhesive 48a to fill the thermal vias 38. Then when the component 36 is reflow soldered onto the thermal pad 52 the thermal vias 38 are already filled thus the solder 40 remains only on the surface of the thermal pad 52. To keep the adhesive from flowing out of the holes, Kapton tape is placed over the holes as a block. When removed, some of the adhesive is pulled out of the hole. For soldering set-up a 1:1 stencil is used still with two passes of the squeegee to ensure material is pressed into the upper portion of the thermal via.

Figure 9:
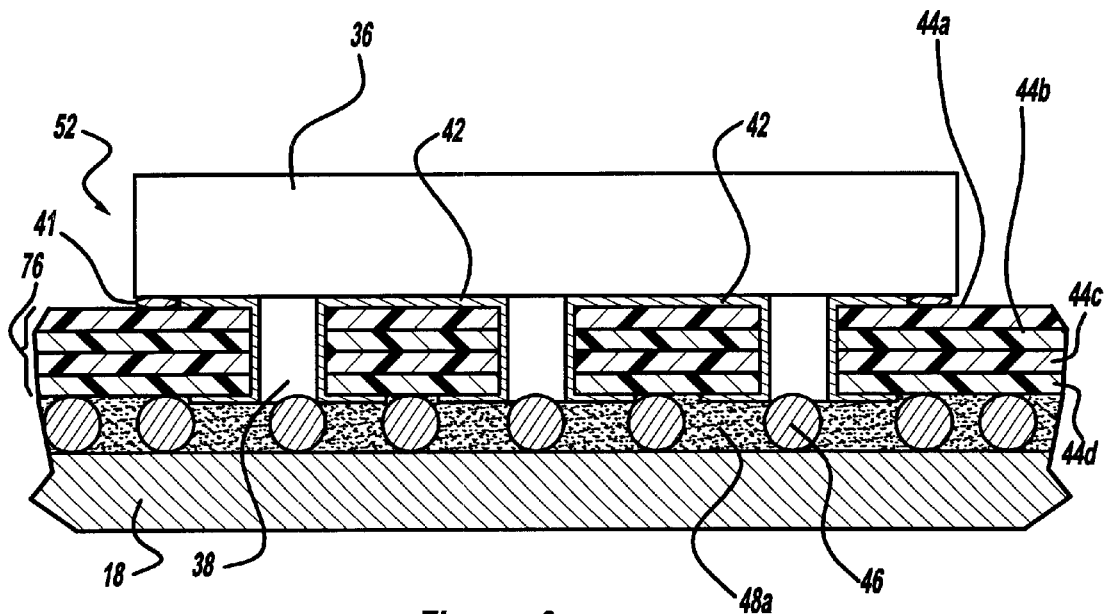
FIG. 9 is a cross sectional view through a thermal via with a surface mount component.

FIG. 9 shows an alternative to the direct thermal pathway described in FIG. 8. Again, once the cores 44a, 44b, 44c, 44d are bonded together, vias 38 are drilled through the PCB 76. The vias 38 and the pad areas 52 are then typically plated with a thermally conductive material 42. The PCB 76 is then adhered to the rigidizer 18 using the thermally conductive adhesive 48a, in this case a liquid containing spacer beads 46. Here the component 35 does not contain a metal stud to be soldered to the thermal pad 52, however, the component 35 is reflow soldered at its distal terminals 47. The solder 41 at the distal terminals 47 acts to fix the component 35 to the PCB 76 and to make electrical contact, however, it does not act as a thermal conductor within the thermal vias 38. In this case the heat from the component 35 is radiated to the thermal pad 52 and the thermal vias 38 rather than traveling through a direct path. This method, however, allows for a more efficient thermal path than if no thermal pad 52 were present and allows a thermal path for components that have no stud. The holes can also have the alternative method described with regard to FIG. 82 and can be filled or partially filled with liquid adhesive 482.

Figure 10:
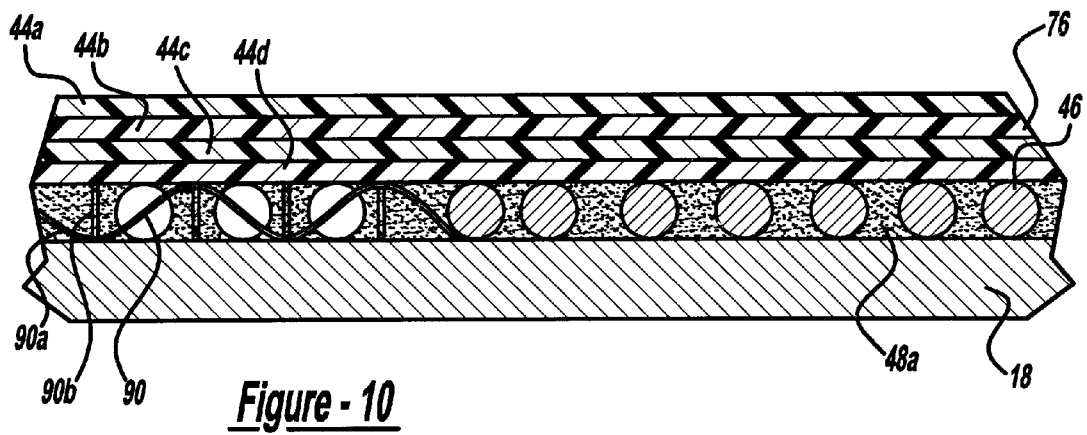
FIG. 10 is a cross sectional view through the printed circuit board and rigidizer showing a ground screen addition for electrical continuity.

Referring to FIG. 10 the PCB 76 is shown in cross-section adhered to the rigidizer plate 18 with the thermally conductive adhesive 48a. Glass beads 46 are disposed in the adhesive to ensure a generally uniform thickness of the adhesive throughout. Furthermore, a metallic screen 90 is disposed in the adhesive 48a and between the PCB 76 and the rigidizer 18. The screen 90 acts an electronic connector between the bottom core layer 44d of the PCB 76 and the rigidizer plate 18. This connection is to ground the PCB 76 to the rigidizer plate 18. The screen 90 is a weave of metal fibers with fibers running perpendicular to one another and on top 90a and below 90b each other. The screen 90 which in the form of a small circular pad ensures that there are always a plurality of actual point contacts between the bottom layer 44d and the rigidizer plate 18 through the adhesive 48a. Furthermore, the screen 90 provides a connector that is relatively clean and does not interfere with the other components. Screen 90 can be in any shape for individual location. Screen 90 can be formed or cut into a strip format or gasket format as well to aid manufacturing. The screen strip, gasket or pad (rectangular or circular) can be tacked down by any industry standard adhesive just to hold it in place for processing. A minimal amount of adhesive is used toward the edge or corners.

Figure 11:
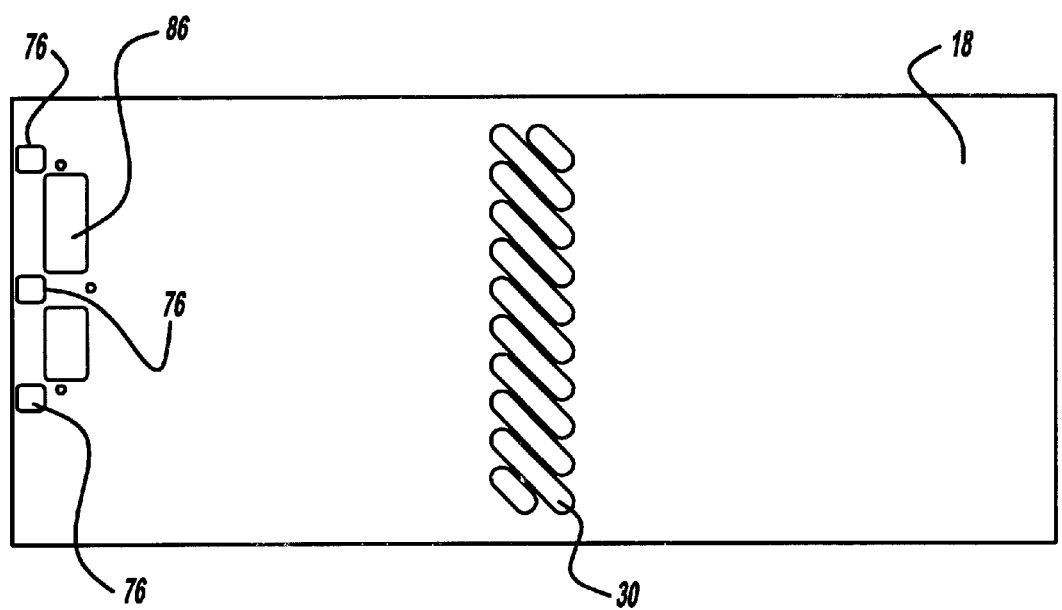
FIG. 11 is a plan view if the rigidizer containing openings.

FIG. 11 shows a plan view of the rigidizer plate 18 alone. A plurality of openings 30 are disposed diagonally along the bend axis 31 and provide a way to relieve stress, from the bending, for both the rigidizer plate and any printed circuit board that is placed over the bend. Additional openings 86 are provided at one end of the rigidizer to receive the board connector 24 (shown in FIG. 1). Openings 76 are provided as guides for being placed in the curing fixture (shown in FIG. 13). The opening guides can be placed further apart for better tolerance in the alignment of the board to the rigidizer.

FIG. 12 shows how the PCB 76 and the rigidizer plate 18 bent upon themselves. Openings 72 in the PCB 76 are disposed over openings 74 in the rigidizer 18 to receive guide pins on the fixture for curing. Further, the PCB 76 is adhered to the rigidizer plate 18 over generally the total area of the PCB 76. This being the case the PCB 76 fully covers the slots 30 (shown in FIG. 11) in the rigidizer plate 18. Thus the internal stress on the PCB 76 created by the bend is relieved by the slots 30.

A pass through, straight pin, gasket connector removes the need for the gasket cover 26. With individual holes for each pin, better structural and RF shielding is achieved. The gasket on the connector 24 allows for sealing, but is optional. The through-hole pins allow for single reglow in processing and eliminates the wave soldering process needed for the first connector 24.

FIG. 13 shows an exploded view of the PCB 76 adhered to the rigidizer plate 18 in the curing fixture 60 and 62. Adhesive masks 71 are placed over the thermal pads 52 of the PCB 76 to prevent adhesive 48b from entering the thermal vias 38 (shown in FIG. 8) during curing. Kapton tape 73 is placed on the under side of the PCB 76, opposite the adhesive masks 71, to ensure that the adhesive mask 71 does not seep onto the tooling. After the adhesive masks 71 have cured the Kapton tape 73 is removed and a layer of spray primer, preferably DOW Corning Primer 4205 is applied substantially to the thermal via areas of the PCB 76 that is to be adhered to the rigidizer plate 18. A layer of the adhesive 48b is placed between the rigidizer plate 18 and the PCB 76. The adhesive layer 48b shown here is a second embodiment of the adhesive. The adhesive layer 48b is a pre-preg film of the liquid adhesive shown in FIG. 8, 9, and 10. However, since the pre-preg film is already a uniform thickness glass beads are not disposed therein but may be included if the material softens during the cure cycle. Once the PCB 76, pre-preg film adhesive 48b and rigidizer 18 have been put together they are placed in a fixture 60, 62. Alternatively the liquid adhesive 48a may be placed on the rigidizer plate 18 through spraying or through a stencil.

The fixture comprises a top plate 60 and a bottom plate 62. The top plate 60 contains a plurality of depressions 66 to accommodate the adhesive masks 71. Further openings 68 are disposed in the top plate 60 as guides for the guide pins 70 on the bottom plate 62. The bottom plate 62 contains a main depression 64, generally the same dimensions as the PCB 76, and rigidizer plate 18, and guide pins 70 to ensure proper placement of the rigidizer plate 18, PCB 76 and the top plate 60. Pressure and heat can then be applied to the fixture 60, 62 to cure the adhesive 48a or 48b to produce a permanent bond between the PCB 76 and the rigidizer plate 18.

Figure 15:
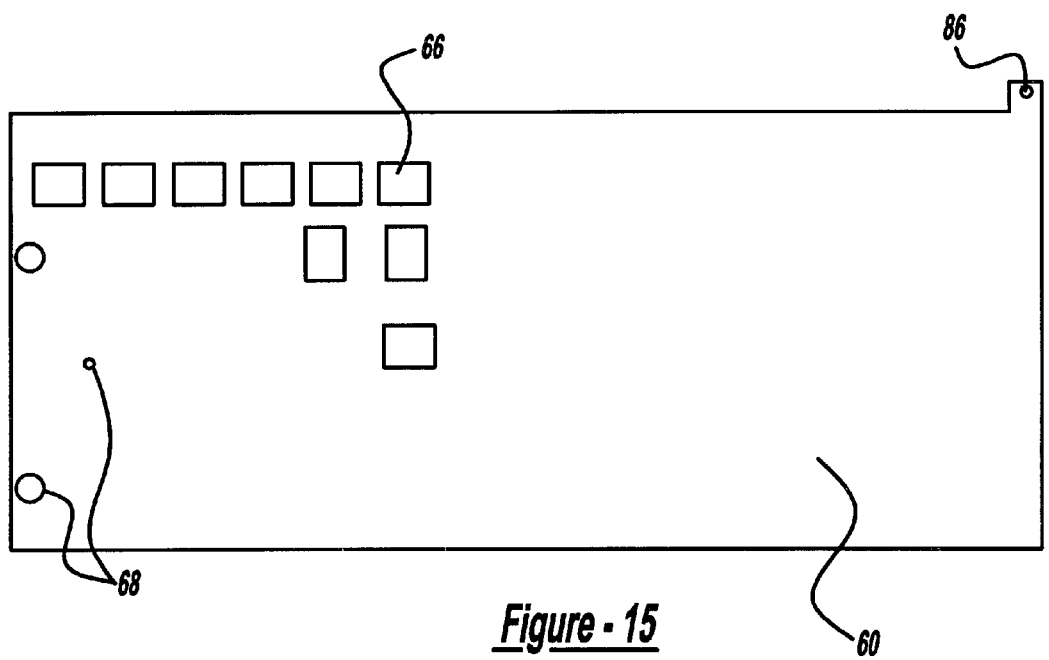
FIG. 15 is a plan view of the top fixture plate.
Figure 14:
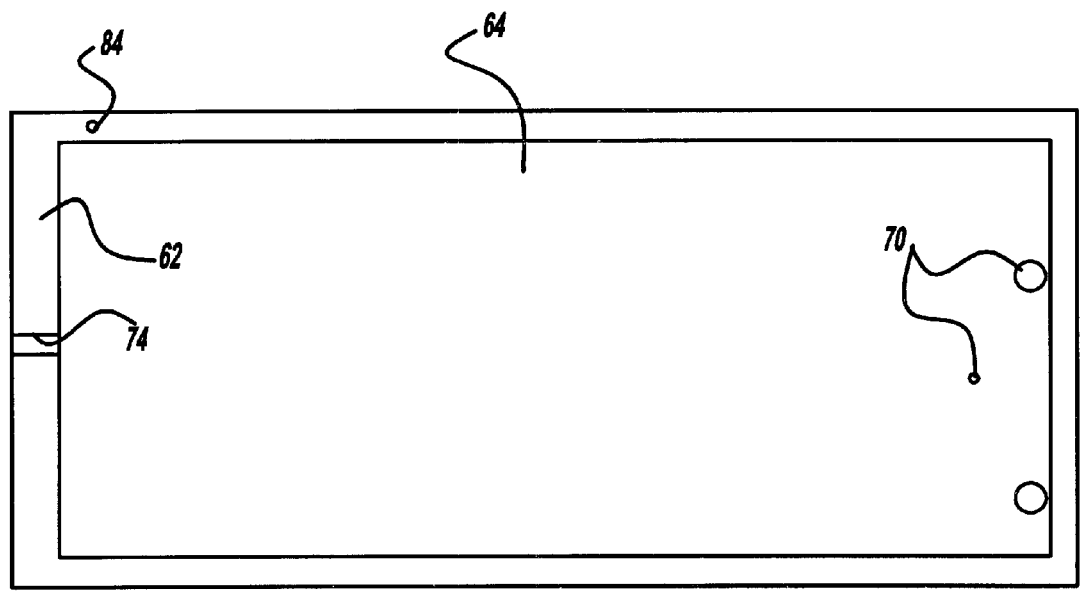
FIG. 14 is a plan view of the bottom fixture plate.

FIGS. 14 and 15 show plan views of the bottom plate 62 and top plate 60 of the fixture, respectively, for curing the adhesive. In particular FIG. 14 shows a plan view of the bottom plate 62. The bottom plate 62 contains guide pins 70 and 84 to ensure that the top plate 60 is placed correctly onto the bottom plate 62. Further, the bottom plate 62 contains a main depression 64 that has the same general dimensions as the rigidizer plate (not shown) and top plate 60. A second minor depression 74 is placed in the rim of the bottom plate 62 to allow the insertion of a tool to pry the top plate 60 off after curing. With reference to FIG. 15 a plan view of the top plate 60 is shown containing openings 68 to receive the guide pins 70 from the bottom plate 62. Another opening 86 is present to receive the additional guide pin 84 from the bottom plate 62. The inside surface of the top plate 60 is generally flat save for the plurality of depressions 66 formed in the surface. The depressions 66 are for receiving the adhesive masks 71 (shown in FIG. 13) when curing the adhesive so that additional pressure is not applied to these areas.

Figure 16:
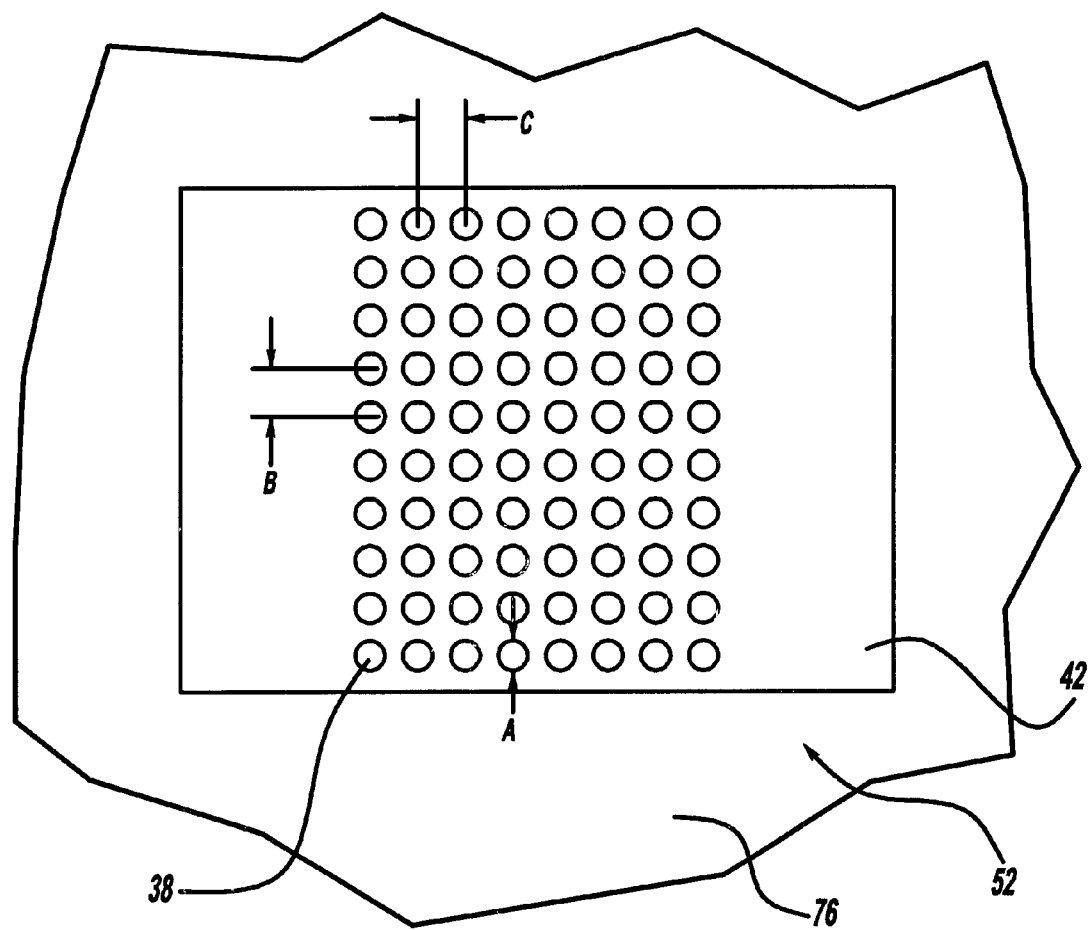
FIG. 16 is a plan view of thermal pad according to the principles of the present invention.

FIG. 16 shows a plan view of a thermal pad 52 with no component affixed to it. The surface of the thermal pad 52, as well as the walls of the thermal vias 38, have been plated with a thermally conductive material 42. The thermal vias 38 are in a Cartesian grid array in straight lines that intersect at generally ninety degree angles. The thermal vias 38 have a preferred diameter A of approximately 0.022 inches. The spacing of both the rows B and the columns C is preferably about 0.0355 inches. The size of the pad 52, and the number size and spacing of the thermal vias 38 may change depending upon various factors. The pad on the top and bottom may be different from each other. Better heat sinking is achieved if the bottom pad is larger than the top pad. If the top pad gets too large problems with soldering can occur (parts swim), so the top pad is sized for optimum soldering and the lower pad as large as the signal density will allow preferably 200% of the size of the top pad.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What I claim is:

1. A circuit board assembly comprising:
   a flexible printed circuit board having first and second sides;
   a rigidizer having first and second sides;
   a thermally conductive adherent, comprising a liquid containing spacing beads, for adhering at least a portion of said second side of said flexible printed circuit board to said first side of said rigidizer; and an electrically conductive screen disposed in the adherent and between a portion of said second side of said flexible circuit board and said first side of said rigidizer.

2. The circuit board assembly of claim 1, wherein said adherent is a pre-preg film.

3. The circuit board assembly of claim 1, wherein said screen is always in electrical contact with said second side of said printed circuit board and with said first side of said rigidizer.

4. The circuit board assembly of claim 1, further comprising thermal vias disposed in said printed circuit board.

5. The circuit board assembly of claim 4, wherein the thermal vias have a thermally conductive material therein.

6. The circuit board assembly of claim 6, wherein the thermally conductive material comprises said thermally conductive adherent.

7. The circuit board assembly of claim 5, wherein the thermally conductive material comprises solder.

8. The circuit board assembly of claim 1, wherein said rigidizer has a major bend radius in a mid portion thereof and openings placed in said rigidizer along said major bend radius.

9. The circuit board assembly of claim 8, wherein the flexible printed circuit board may bend substantially 180 degrees over itself and wherein the flexible printed circuit board remains substantially against the first side of the rigidizer.

10. The circuit board assembly of claim 9, wherein the openings are generally oblong in shape and diagonal to the major bend radius such that the opening radius stresses on a portion of the flexible circuit board when the circuit board and the rigidizer are bent substantially over themselves at approximately 180 degrees.

11. The circuit board assembly of claim 1, wherein the spacing beads are of a generally uniform diameter so as to ensure a generally uniform thickness of adherent under the printed circuit board.

12. The circuit board assembly of claim 1, wherein the rigidizer acts as a heat sink for the printed circuit board.

13. The circuit board assembly of claim 1, wherein the rigidizer further includes first and second side edges and first and second ends, and wherein the assembly further comprises:

at least one side rail having a first side with a groove formed therein for receiving a portion of the first side edge of the rigidizer; and and end cap coupled to the at least one side rail.

14. The circuit board assembly of claim 13, wherein the rigidizer and the printed circuit board are bent over themselves.

15. The circuit board assembly of claim 14, wherein the groove is generally "U"-shaped for receiving a portion of the first side of the rigidizer bent over itself.

16. The circuit board assembly of claim 14, wherein the end cap further includes first and second grooves for respective receipt of the first and second ends of the rigidizer.

17. The circuit board assembly of claim 16, further comprising a second side rail having a first side wall, a generally "U"-shaped grooved formed therein for receiving a portion of the second side edge of the rigidizer, whereby the rigidizer, the first and second side rails and the end cap form a housing for the printed circuit board.

\* \* \* \* \*